US007701230B2

(12) United States Patent
Ye et al.

(10) Patent No.: US 7,701,230 B2

(45) Date of Patent: Apr. 20, 2010

(54) METHOD AND SYSTEM FOR ION BEAM PROFILING

(75) Inventors: John Zheng Ye, Brighton, MA (US); Michael Paul Cristoforo, Beverly, MA (US); Yongzhang Huang, Hamilton, MA (US); Michael A. Graf, Belmont, MA (US); Bo H. Vanderberg, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 330 days.

(21) Appl. No.: 11/742,178

(22) Filed: Apr. 30, 2007

(65) Prior Publication Data

US 2008/0265866 A1 Oct. 30, 2008

(51) Int. Cl.
*G01R 27/08* (2006.01)
*H01J 37/08* (2006.01)

(52) U.S. Cl. .................................. 324/713; 250/492.21

(58) Field of Classification Search ................. 324/713, 324/649, 600, 71.3, 71.1; 250/492.1, 492.2, 250/492.21, 492.23, 492.3, 397
See application file for complete search history.

(56) References Cited

U.S. PATENT DOCUMENTS 4,878,014 A * 10/1989 Simpson .................... 324/71.3
5,198,676 A 3/1993 Benveniste et al.
7,005,656 B1 2/2006 Sud et al.
7,109,499 B2 9/2006 Angel et al.
7,355,188 B2 * 4/2008 Olson et al. ............ 250/492.21
7,381,977 B2 * 6/2008 Pollock et al. ......... 250/492.21
7,479,644 B2 * 1/2009 Ryding et al. ............ 250/491.1
2005/0191409 A1 9/2005 Murrell et al.
2006/0006346 A1 1/2006 Rathmell et al.
2006/0219936 A1 10/2006 Olson et al.
2008/0073581 A1 * 3/2008 Ikejiri .................... 250/492.21

OTHER PUBLICATIONS

International Search Report For Application # PCT/US2008/004374 Dated Sep. 1, 2008.

* cited by examiner

*Primary Examiner*—Hoai-An D Nguyen
(74) *Attorney, Agent, or Firm*—Eschweiler & Associates, LLC

(57) ABSTRACT

One embodiment of the invention relates to an apparatus for profiling an ion beam. The apparatus includes a current measuring device having a measurement region, wherein a cross-sectional area of the ion beam enters the measurement region. The apparatus also includes a controller configured to periodically take beam current measurements of the ion beam and to determine a two dimensional profile of the ion beam by relating the beam current measurements to sub-regions within the current measuring device. Other apparatus and methods are also disclosed.

14 Claims, 9 Drawing Sheets

METHOD AND SYSTEM FOR ION BEAM PROFILING

FIELD OF THE INVENTION

The present invention relates generally to ion implantation systems, and more specifically to an apparatus and method for determining a profile of an ion beam.

BACKGROUND OF THE INVENTION

In the semiconductor industry, various manufacturing processes are typically carried out on a workpiece (e.g., a semiconductor wafer) in order to achieve various results thereon. Processes such as ion implantation, for example, can be performed in order to obtain a particular characteristic on or within the workpiece, such as doping a layer on the workpiece by implanting a specific type of ion. Conventionally, ion implantation processes are performed in either a batch process, wherein multiple workpieces are processed concurrently, or in a serial process, wherein a single workpiece is individually processed.

In general, it is desirable to provide uniform implantation of the surface of the workpiece, (i.e. ensure that implant properties such as dose, angle, power density deposited, etc., are uniform across the surface). However, at the plane of the workpiece the current or charge of a typical ion beam can vary significantly across a cross-section of the beam, and such variation can lead to a potential non-uniform implantation of the workpiece in both batch processes and serial processes. Therefore, it is generally desirable to accurately measure a profile and/or trajectory of the ion beam as it would impact the workpiece (i.e., at the workpiece plane). Conventionally, such a profile measurement of the ion beam has been a cumbersome and/or time consuming process that is separate from the implantation process, and which requires additional hardware that is difficult to integrate into the implanter. Therefore, profiles are frequently not measured at all, but rather implantations are often merely based on assumptions of how the ion beam should appear for a given set of input parameters.

Therefore, a need currently exists for an apparatus, system, and method for determining a profile of an ion beam, wherein a charge distribution across the ion beam can be empirically determined in a highly efficient manner.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

One embodiment of the invention relates to an apparatus for profiling an ion beam. The apparatus includes a current measuring device having a measurement region, wherein a cross-sectional area of the ion beam enters the measurement region. The apparatus also includes a controller configured to periodically take beam current measurements of the ion beam and to determine a two dimensional profile of the ion beam by relating the beam current measurements to sub-regions within the current measuring device.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
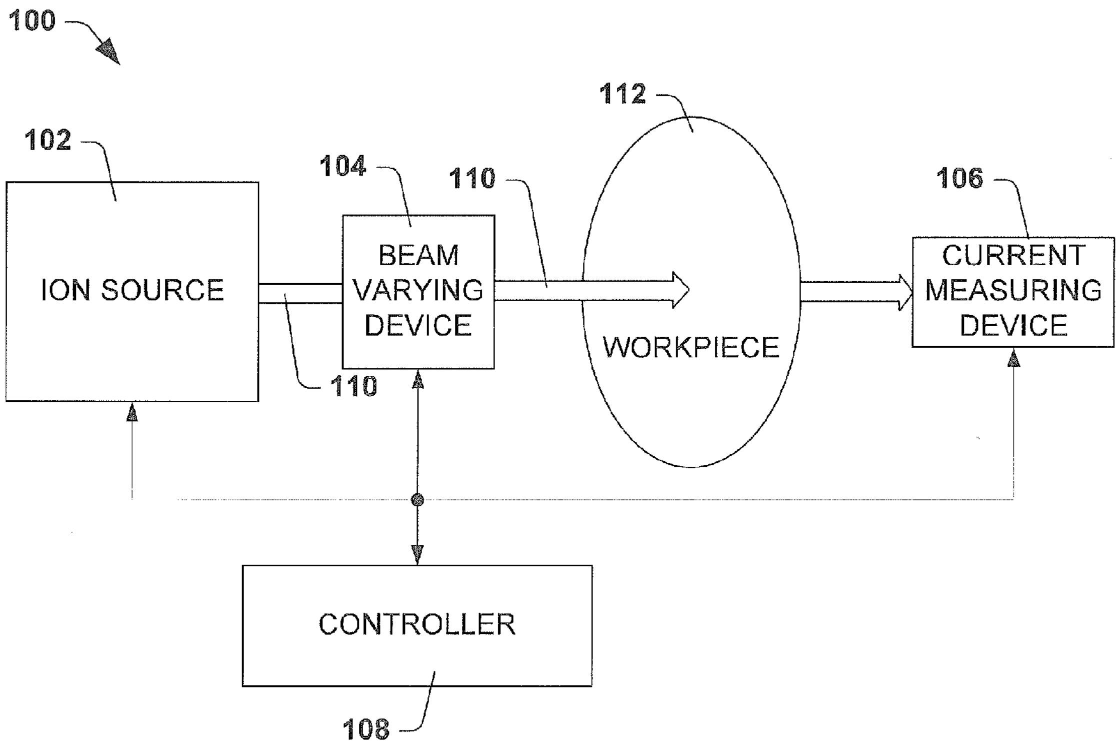
FIG. 1 illustrates one embodiment of an apparatus for profiling an ion beam.

The present invention is directed generally towards an apparatus, system, and method for determining a profile and/or trajectory of an ion beam as it relates to an implantation of ions into workpiece. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

FIG. 1 shows one embodiment of an apparatus 100 for profiling an ion beam emitted from an ion source. The apparatus includes an ion source 102, a beam varying device 104, a current measuring device 106, and a controller 108. A workpiece 112 may be positioned (e.g., mounted on the beam varying device 104) within the beam path to receive the ion beam 102.

Typically the ion source 102 emits an ion beam 110 as a stream of charged particles or ions. Beam steering optics (not shown), which often utilize magnetic and/or electric fields, may steer the ion beam along a beam path.

As the ion beam 110 travels along the beam path, the beam varying device 104 can interact with the beam and thereby vary it in any number of ways. In particular, the beam varying device 104 may adjust the cross-sectional area of the beam that passes therethrough.

After the ion beam 110 (or at least a portion thereof) passes through the beam varying device 104, the ion beam 110 proceeds to the current measuring device 106, which has a measurement region that can comprise a number of smaller sub-regions. In one embodiment, the current measuring device 106 includes a single Faraday cup and the sub-regions are merely mathematical constructs within the Faraday cup. In other embodiments, the current measuring device 106 includes a number of Faraday cups, for example, such that each sub-region corresponds to one Faraday cup. The beam varying device 104 can dynamically adjust a cross-sectional area of the ion beam that enters the measurement region in any number of ways, one of which includes moving an object into the ion beam as discussed further below. By periodically taking beam current measurements while adjusting the cross-sectional area of the ion beam, the controller 108 can determine a two dimensional beam profile. In one advantageous embodiment, the apparatus can repeatedly determine the beam profile while a workpiece is implanted.

In other non-illustrated embodiments, the workpiece 112 may be positioned behind the current measuring device 106. Further, in various embodiments, the beam varying device 104 and the current measuring device 106 are aligned in the beam path only during calibration or at another time when the beam profile is measured, although these components could also be permanently positioned within the beam path in other embodiments.

As one general apparatus 100 has now been described, some beam profiles are now described in order to more fully appreciate some aspects of the invention. Typically, beam profiles are a function of numerous variables and can change with variations in ion generation, extraction from an ion source, and beam transport. In addition, change in vacuum conditions, thermal expansion of components, and so on will change these variables and change the beam profile.

Figure 2A:
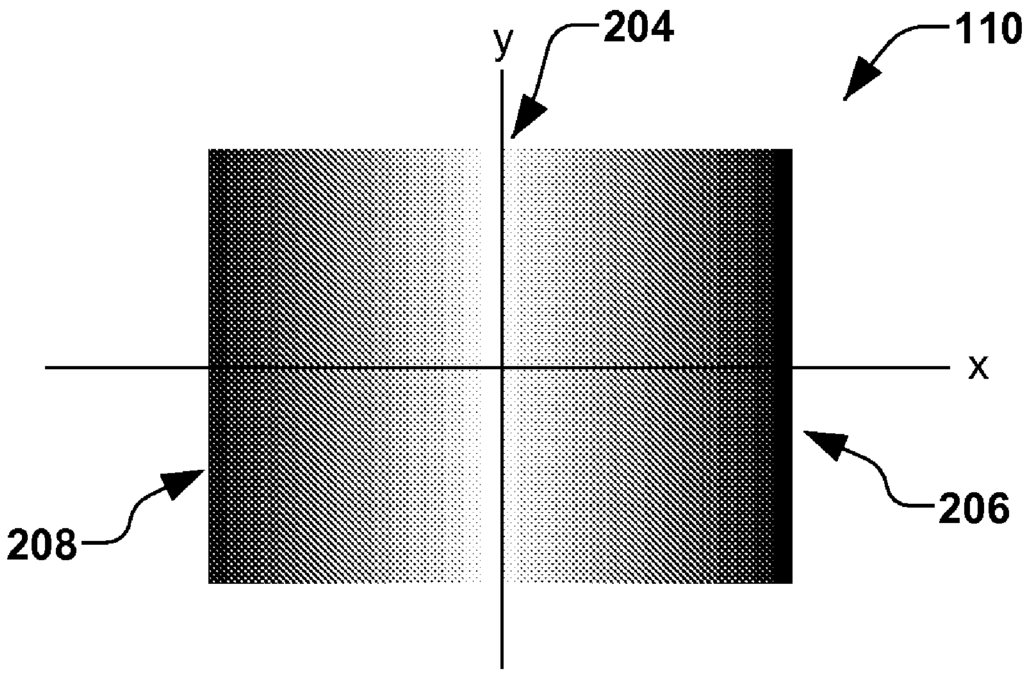
FIG. 2A-2B illustrates a two-dimensional beam profile that can be measured in accordance with aspects of the present invention.
Figure 2B:
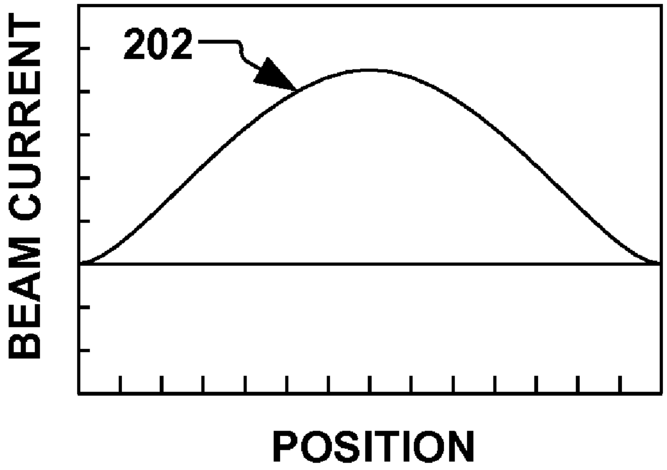

An example of a manner in which a two-dimensional beam profile of one ion beam may vary is shown in FIG. 2A-2B, wherein the beam's intensity is shown as varying in only a single dimension (i.e., the x-axis) over its cross-sectional surface area. FIG. 2A illustrates the ion beam 110 as viewed perpendicular to the beam path, wherein FIG. 2B further illustrates a charge or current distribution 202 across the ion beam. As can be seen in FIG. 2B, a center region 204 of the ion beam 110 has a greater beam current intensity than edges 206, 208 of the ion beam, thus providing the generally bell-shaped curve 202 of beam current versus position along the ion beam. While the curve 202 illustrated in FIG. 2B is generally symmetric about the center region 204 of the ion beam 110, it should be noted that other beam profiles are often not symmetric about the center region.

Figure 3A:
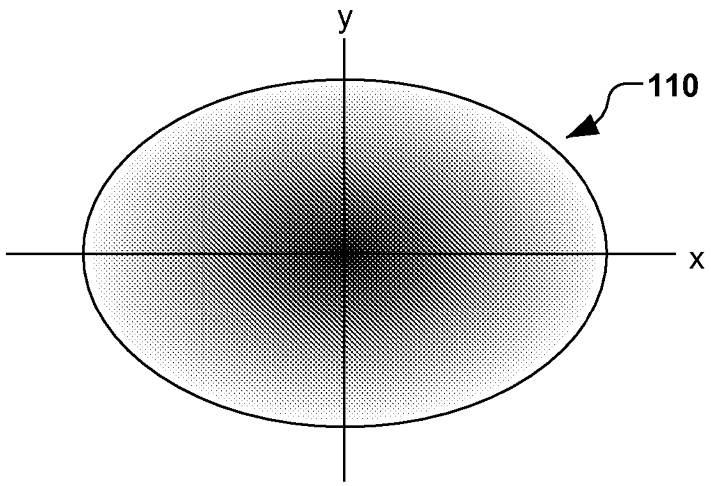
FIG. 3A-3C illustrates a two-dimensional beam profile that can be measured in accordance with aspects of the present invention.
Figure 3B:
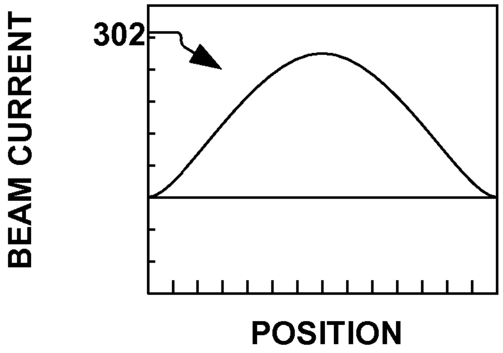
Figure 3C:
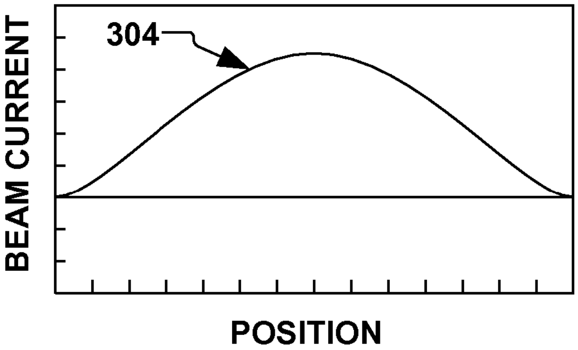

FIGS. 3A-3C show one manner in which a two-dimensional beam profile of another ion beam 110 may vary across two-dimensions over its cross sectional area. These figures again illustrate the ion beam 110 as viewed perpendicular to the beam path, wherein FIG. 3B shows the integrated charge or current distribution 302 along the x-axis of the beam while FIG. 3C shows the integrated current distribution 304 along the y-axis of the beam. Thus, the integrated current distribution 304 is integrated along the x- or y-direction, respectively. These integrals are particularly important for predicting the dopant distribution over the surface of the workpiece as the beam is swept across the workpiece, either in the manner of a serial or batch tool, where the dopant concentration at a location on the workpiece is the integral of the current density at that location.

Figure 5:
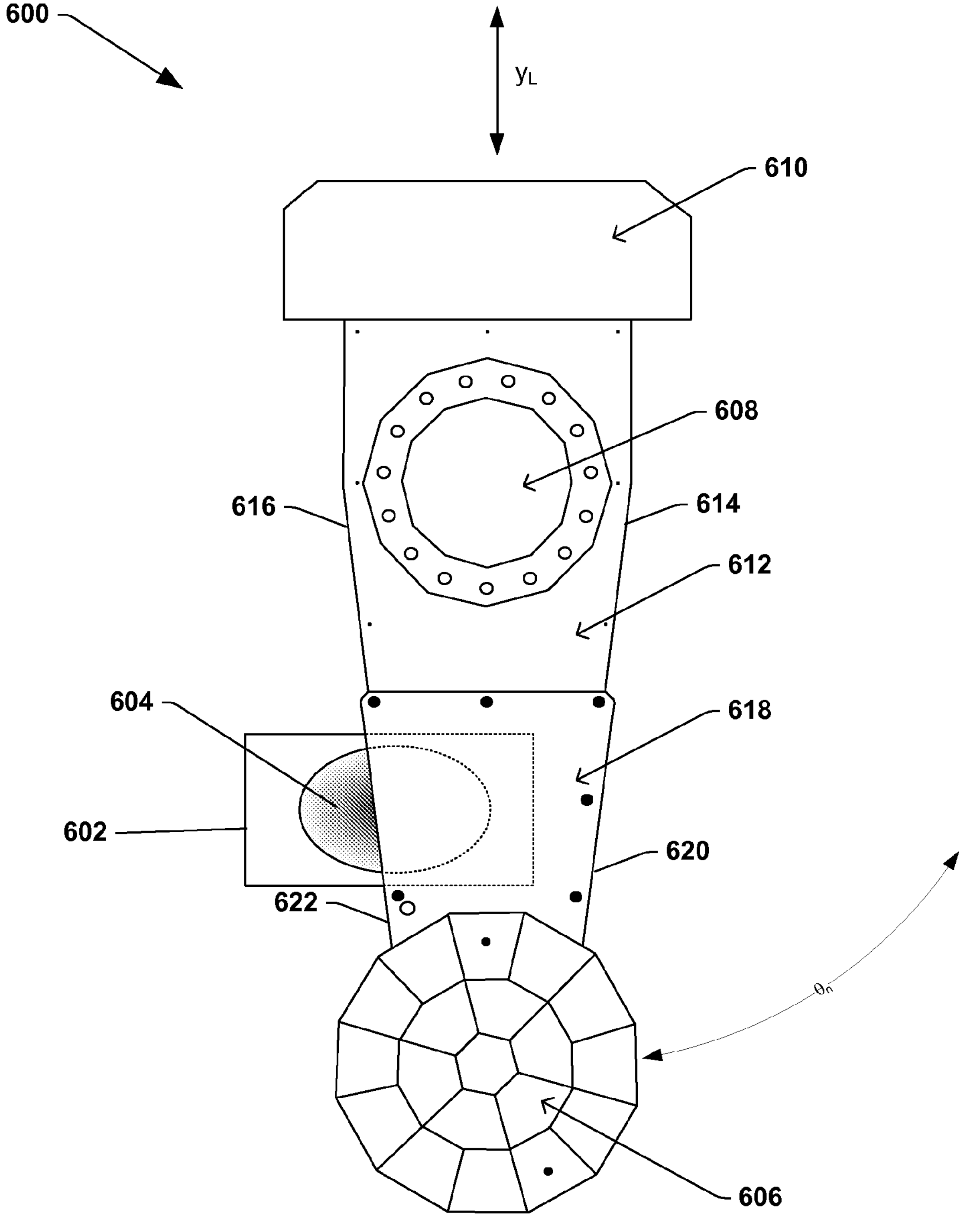
FIG. 5 illustrates another embodiment of a beam varying device.
Figure 6:
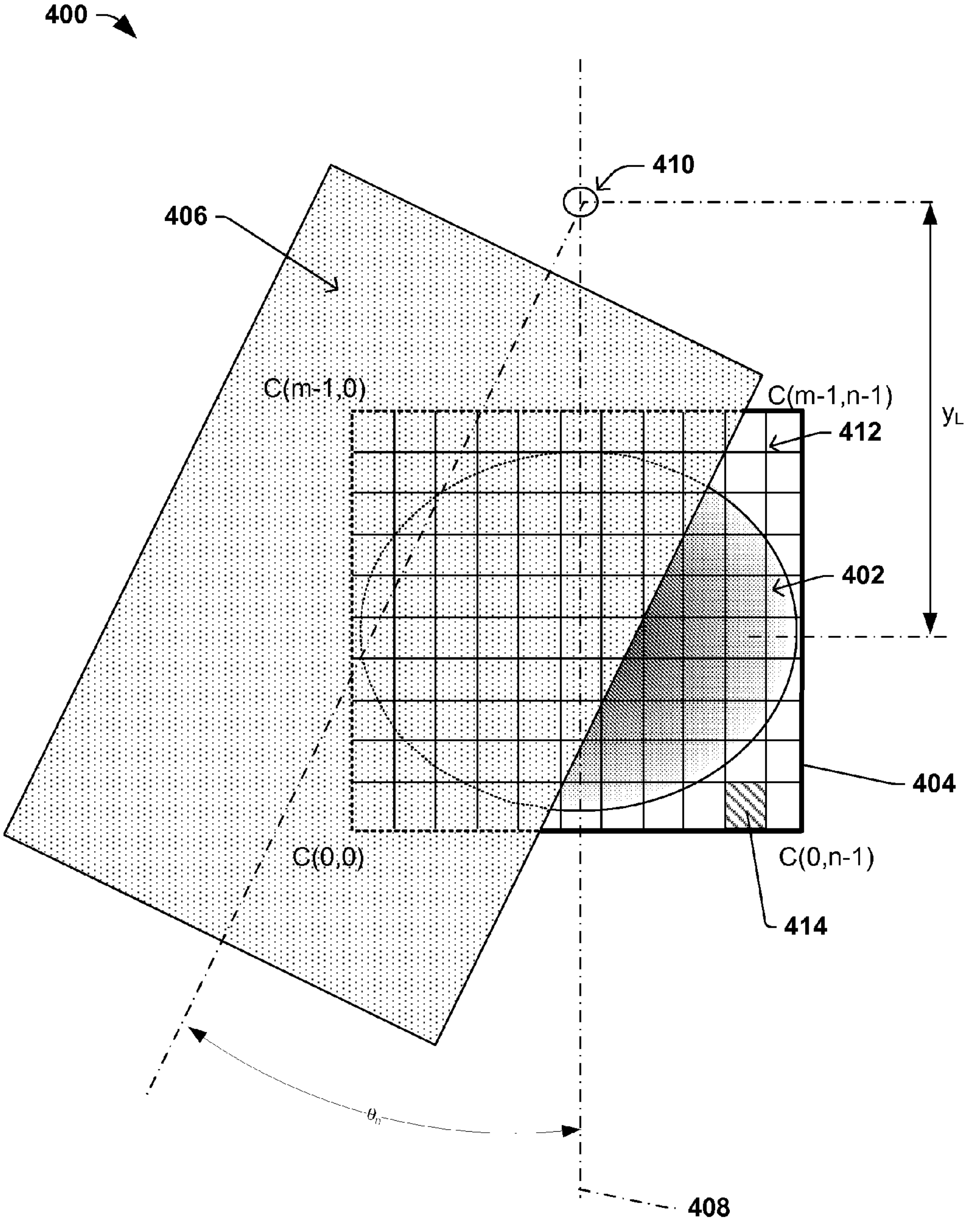
FIG. 6 illustrates one embodiment of a beam varying device and a measurement region that is discretized into sub-regions.

Thus, to evenly implant ions across the workpiece, for calibration purposes, or for other purposes; it may be highly desirable to accurately determine the current profile of the ion beam. While FIG. 1 described a general apparatus for determining the current profile of the ion beam, FIGS. 4-6 are now discussed with reference to more detailed apparatus for determining the current profile of the ion beam. In these illustrated embodiments as well as other embodiments, the beam varying device 104 (FIG. 1) can comprise an object configured to at least partially obstruct the cross-sectional area of the ion beam that enters the measurement region of the current measuring device. Although the figures provided and discussed herein show a limited number of object shapes, the systems and algorithms disclosed herein can cope with a wide variety of object shapes and paths of movement and, in fact, any edge shape or path of movement could be used. As will be more fully appreciated herein, to determine the two-dimensional profile, the apparatus 400 may selectively manipulate two independent variables, namely, a rotational angle $\theta_k$ and a vertical distance $y_L$.

Figure 4A:
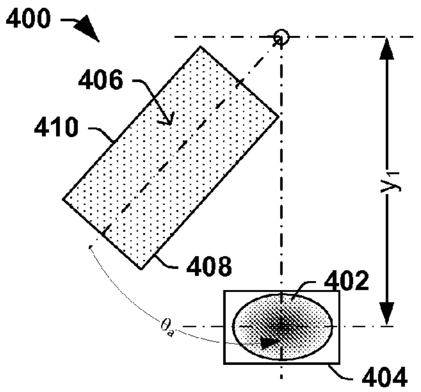
FIG. 4A-4O illustrates one embodiment of a beam varying device including an object that may obstruct the beam.
Figure 4B:
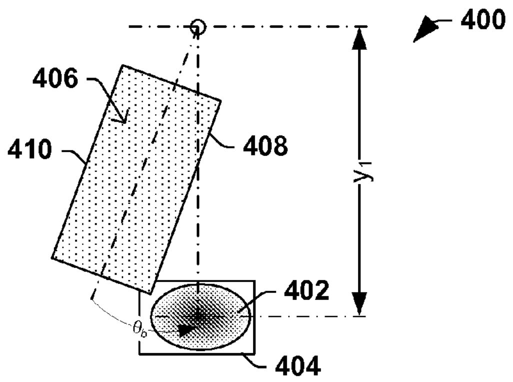
Figure 4C:
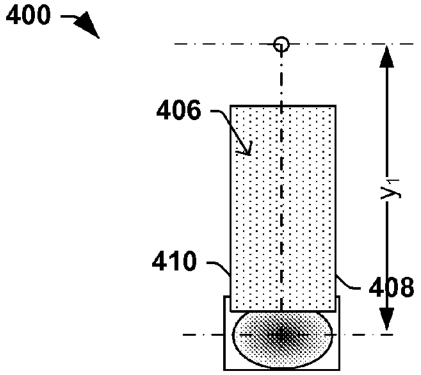
Figure 4D:
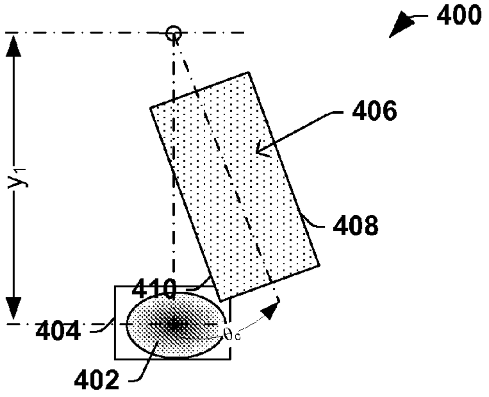
Figure 4E:
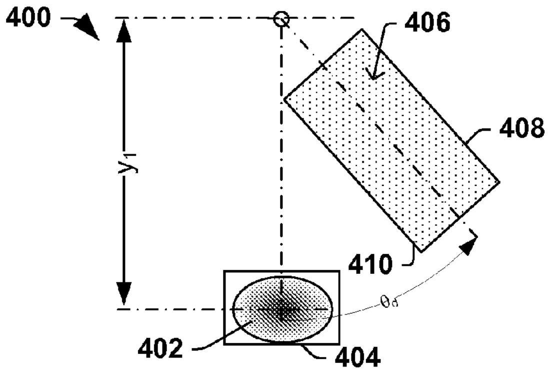
Figure 4F:
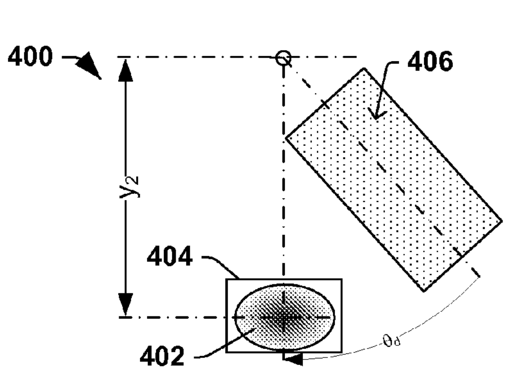
Figure 4G:
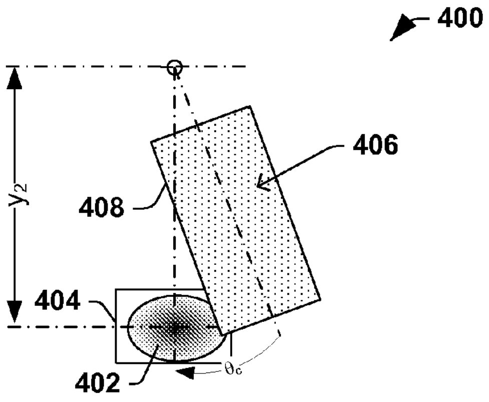
Figure 4H:
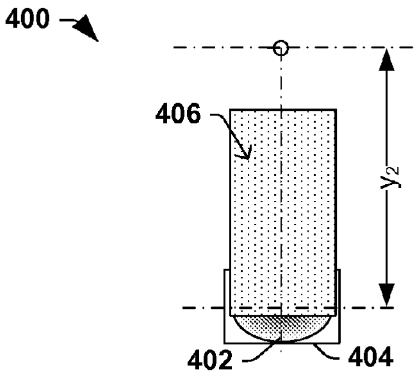
Figure 4I:
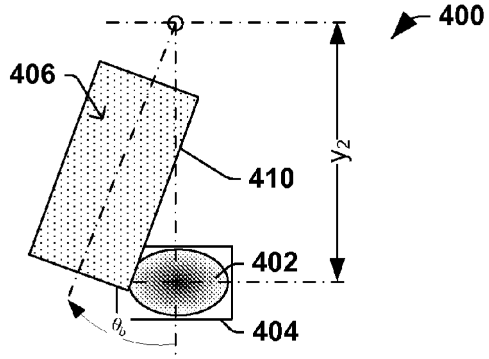
Figure 4J:
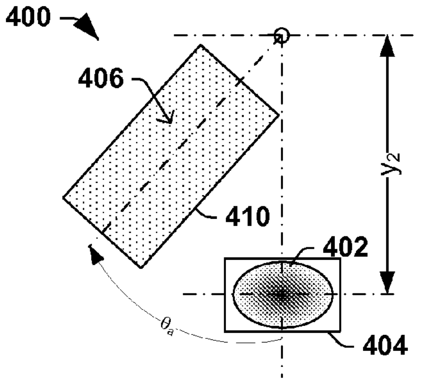
Figure 4K:
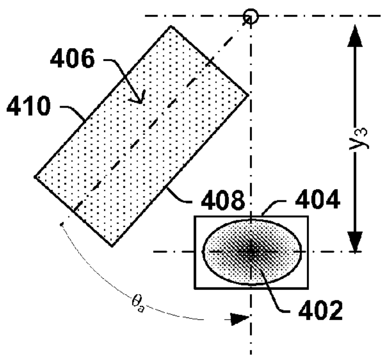
Figure 4L:
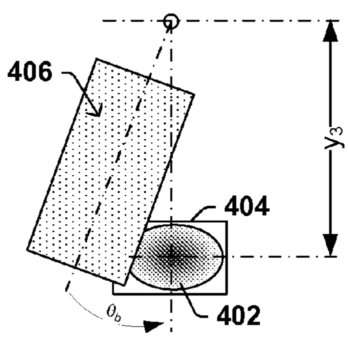
Figure 4M:
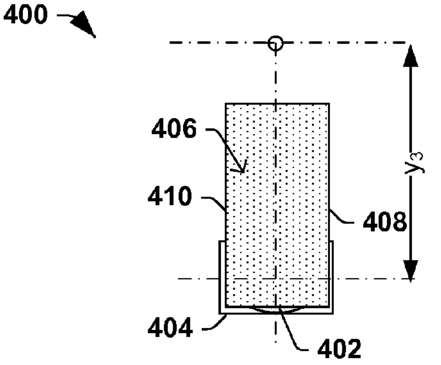
Figure 4N:
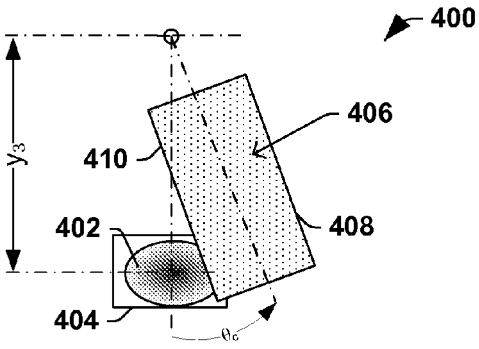
Figure 4O:
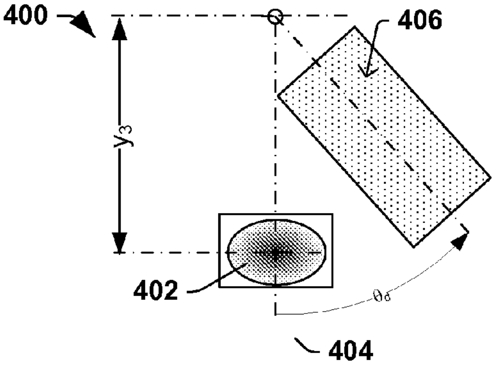

For the convenience of explanation, FIG. 4A-4O show an object 406 sweeping across the ion beam 402 and a current reading device 404 as a function of an angle $\theta_k$ and vertical distance $y_L$, wherein the object 406 is shown as a rectangular block that swings in a pendulum-like manner. In one embodiment, a single pass of the object (i.e., a half-period) may correspond to one incremental movement $y_L$ along the axis. Thus, FIG. 4A-4E show a single pass of the object at distance $y_1$, while FIG. 4F-4J show another single pass of the object at distance $y_2$, and FIG. 4K-4O show still another pass of the object at distance $y_3$. As shown, the object 406 intercepts the ion beam 402 at various scan locations, each of which could produce a different beam current measurement.

Referring now to FIG. 4A-4E, one can see a series of beam current measurements while the beam 402 is at a first distance $y_1$. In FIG. 4A the object 406 is at angle $\theta_a$ and vertical distance $y_1$ and does not obstruct the cross-sectional area of the ion beam, therefore the entire the cross-sectional area of the beam 402 proceeds into the current measuring device 404. Thus in FIG. 4A, the current reading device will measure the entire beam current. Similarly, in FIG. 4B the object has proceeded to angle $\theta_b$ and now partially obstructs the measurement region, although the object still does not obstruct the cross sectional area of the beam. Thus, all relatively large fraction of the total beam current will still be measured. In FIG. 4C however, the object 406 slightly obstructs the cross-sectional area of the beam. Therefore only an unobstructed portion of the beam proceeds into the current measuring device, and the current reading device will measure a smaller fraction of the total beam current because the object blocks the obstructed portion of the beam (not visible) from reaching the current measuring device.

In general, as the leading edge of the object 408 sweeps further into the beam 402 the current measurement will decrease. On the other hand, as the trailing edge 410 of the object sweeps out of the beam 402, the current measurement will tend to increase.

Referring now to FIG. 4F-4J, one can see another series of beam current measurements as the beam 402 and measuring device 404 have incrementally moved upwards a distance $y_2$ relative to the pivot point of the object. Again in FIG. 4F, the current reading device will measure a relatively fraction of the total large beam current because the beam is unobstructed. However, in FIG. 4G the leading edge 408 of the object starts to obstruct the cross-sectional area of the beam and the current reading device will start to measure a smaller fraction of the total beam current. In FIG. 4H, the beam is partially obstructed, and a relatively low fraction of the total beam current will be measured.

Referring now to FIG. 4K-4O, one can see another series of beam current measurements as the beam 402 and measuring device 404 have incrementally moved upwards a distance $y_3$ relative to the pivot point of the object. Again in FIG. 4K, the current reading device will measure a relatively large fraction of the total beam current because the beam is unobstructed. However, in FIG. 4L the object has proceeded to angle $\theta_b$ and partially obstructs the cross-sectional area of the beam. Therefore, only an unobstructed portion of the beam proceeds into the current measuring device, and the current reading device will measure a smaller fraction of the total beam current. In FIG. 4M, the beam is almost entirely obstructed, and a low fraction of the total beam current will be measured. As the object swings upward in FIG. 4N-4O, the beam current will increase again.

FIG. 5 shows a more detailed beam-varying device that comprises a scan arm 600 of an ion implanter, wherein the scan arm 600 is shown in relation to a current measuring device 602 through which an ion beam 604 is passing. The scan arm has an assembly 606 to which a wafer can be mounted. During implantation of the wafer, the scan arm incrementally moves the wafer through a vertical distance $y_L$ while rotating about a pivot point 608 in a pendulum-like manner. A counterbalance 610 aids in the rotation process. The assembly 606, pivot point 608, and counterbalance 610 may be coupled to one another by a first plate 612 having two angled edges 614, 616 and a second plate 618 having edges 620, 622. Either plate 612, 618 maybe any shape, including square, rectangular, oblong, circular, or any other shape.

Thus, even if the entire scan arm rotates to an angle such that it is not in the plane of the paper, the previously described method still applies. An advantage of this feature lies in the fact that a two-dimensional profile can be taken not only before implantation starts with a straight leading edge, but also after implantation starts with an arbitrary edge projection. This latter feature allows for real-time monitoring of the two dimensional beam profile, which enables two dimensional beam profile embedded on implant process control.

Referring now to FIG. 6, one can see a more detailed apparatus 400 for measuring a two dimensional profile of an ion beam 402 by using a current measuring device 404 in combination with an object 406 that can at least partially obstruct the ion beam by various degrees when the object is directed to move across the beam in a controlled fashion. In one embodiment, the object 406 can swing in a pendulum-like manner and can be translated over an axis 408 that runs perpendicular to the axis of rotation (e.g., distance $y_L$). In the illustrated embodiment, the axis of rotation (not shown) extends out of the plane of the page at the pivot point 410 about which the object 406 is rotated. Thus, to determine the two-dimensional profile, the apparatus 400 manipulates two independent variables, namely, a rotational angle $\theta_k$ and a distance $y_L$.

As shown in FIG. 4, to calculate the beam profile the measurement region 412 of the current measuring device 404 can be conceptualized into a number of sub-regions (e.g., 414), wherein each can have a discrete beam current associated therewith. As the various beam current measurements are taken (e.g., as a function of rotational angle and vertical distance), the apparatus can correlate the results with the sub-regions. In one embodiment, multiple sub-regions relate to at least one individual Faraday cup where in the sub-regions are mathematical constructs with and that at least one individual Faraday cup.

In one embodiment the measurement region 412 of the current measuring device 404 is represented by a system of linear equations with m×n unknowns.

Thus, as shown in FIG. 5, the sub-regions could but do not have to be arranged in grid-like fashion, wherein there are n columns and m rows. For each element within the matrix, the beam current that the element represents can be completely obstructed by the object, not obstructed in any way by the object (i.e., pass completely into the current measuring device), or partially intercepted by the edge of the object. As a result, contribution of each current, $C^{i,j}$, of each discrete element towards the final Faraday reading is modulated by a multiplication factor, $\delta_\kappa^{i,j}=0$, or 1, or a number in between 0 and 1, depending upon where the element is located with respect to the edge of the object. The multiplication factor can be calculated from geometry, i.e. the known position of the obstruction element and the current measuring device. Thus, at any particular object location that is determined by the angle $\theta_k$, and translation position $y_L$ where k=0, 1, . . . , p and I=1 . . . q; an (m×n)×(p×q) matrix is built up such that the total beam current contribution to the current measuring device would be:

$$I^{\theta_k,y_l} = \sum_{i=1}^{m}\sum_{j=1}^{n}\delta_{k,l}^{i,j}C^{i,j},\quad k=1\ \ldots\ p,\quad l=1\ \ldots\ q \tag{1}$$

where $\delta_\kappa^{i,j}=0$ if the sub-region is fully obstructed, 1 if the sub-region is not obstructed whatsoever, or a number between 0 and 1 if the sub-region is partially obstructed.

Thus, expression (1) is the sum of a number of discrete beam currents, wherein each discrete beam current represents the current density passing through a sub-region of the measurement region. Moreover, each discrete beam current is periodically measured as a function of the angle $\theta_k$ and the translation position $y_L$, although it will be appreciated that the discrete beam current could be measured as a function of other variables such as time or another spatial dimension depending on the shape of the object.

For a matrix consisting of m×n different rotational angle and translation values (that is in the special case when p×q=m×n), a system of linear equations can be constructed which satisfies the following, $$\begin{pmatrix}
\delta_0^{0,0} & \delta_0^{0,1} & \ldots & \delta_0^{0,n-1} & \delta_0^{1,0} & \ldots & \delta_0^{1,n-1} & \ldots & \delta_0^{m-1,0} & \delta_0^{m-1,1} & \ldots & \delta_0^{m-1,n-1} \\
\delta_1^{0,0} & \delta_1^{0,1} & \ldots & \delta_1^{0,n-1} & \delta_1^{1,0} & \ldots & \delta_1^{1,n-1} & \ldots & \delta_1^{m-1,0} & \delta_1^{m-1,1} & \ldots & \delta_1^{m-1,n-1} \\
\ldots & \ldots & \ldots & \ldots & \ldots & \ldots & \ldots & \ldots & \ldots & \ldots & \ldots & \ldots \\
\delta_{m-2,n-1}^{0,0} & \delta_{m-2,n-1}^{0,1} & \ldots & \delta_{m-2,n-1}^{0,n-1} & \delta_{m-2,n-1}^{1,0} & \ldots & \delta_{m-2,n-1}^{1,n-1} & \ldots & \delta_{m-2,n-1}^{m-1,0} & \delta_{m-2,n-1}^{m-1,1} & \ldots & \delta_{m-2,n-1}^{m-1,n-1} \\
\delta_{m-1,n-1}^{0,0} & \delta_{m-1,n-1}^{0,1} & \ldots & \delta_{m-1,n-1}^{0,n-1} & \delta_{m-1,n-1}^{1,0} & \ldots & \delta_{m-1,n-1}^{1,n-1} & \ldots & \delta_{m-1,n-1}^{m-1,0} & \delta_{m-1,n-1}^{m-1,1} & \ldots & \delta_{m-1,n-1}^{m-1,n-1}
\end{pmatrix}
\begin{pmatrix} C^{0,0} \\ C^{0,1} \\ \ldots \\ C^{m-2,n-1} \\ C^{m-1,n-1} \end{pmatrix}
=
\begin{pmatrix} I_0^\theta \\ I_1^\theta \\ \ldots \\ I_{m-2,n-1}^\theta \\ I_{m-1,n-1}^\theta \end{pmatrix} \tag{2}$$

This is a system of linear equations containing m×n variables and m×n equations, $$(\delta)_{mn\times mn}(C)_{mn\times l}=(I)_{mn\times l}, \quad (3)$$

which may exhibit a solution, $$(C)_{mn\times l}=(\delta)_{mn\times mn}^{-1}(I)_{mn\times l}, \quad (4)$$

Where $(\delta)_{mn\times mn}^{-1}$ is the inverse matrix of $(\delta)_{mn\times mn}$. If the matrix δ is singular or ill-conditioned, other well-known numerical methods rather than direct inversion, such as optimization routines, can be used.

In addition to or in substitution of one or more of the illustrated components, the illustrated communication system and other systems of the invention include suitable circuitry, state machines, firmware, software, logic, etc. to perform the various methods and functions illustrated and described herein, including but not limited to the methods described below. While the methods illustrated herein are illustrated and described as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the operation of systems which are illustrated and described herein (e.g., apparatus 100 in FIG. 1) as well as in association with other systems not illustrated, wherein all such implementations are contemplated as falling within the scope of the present invention and the appended claims.

Figure 7:
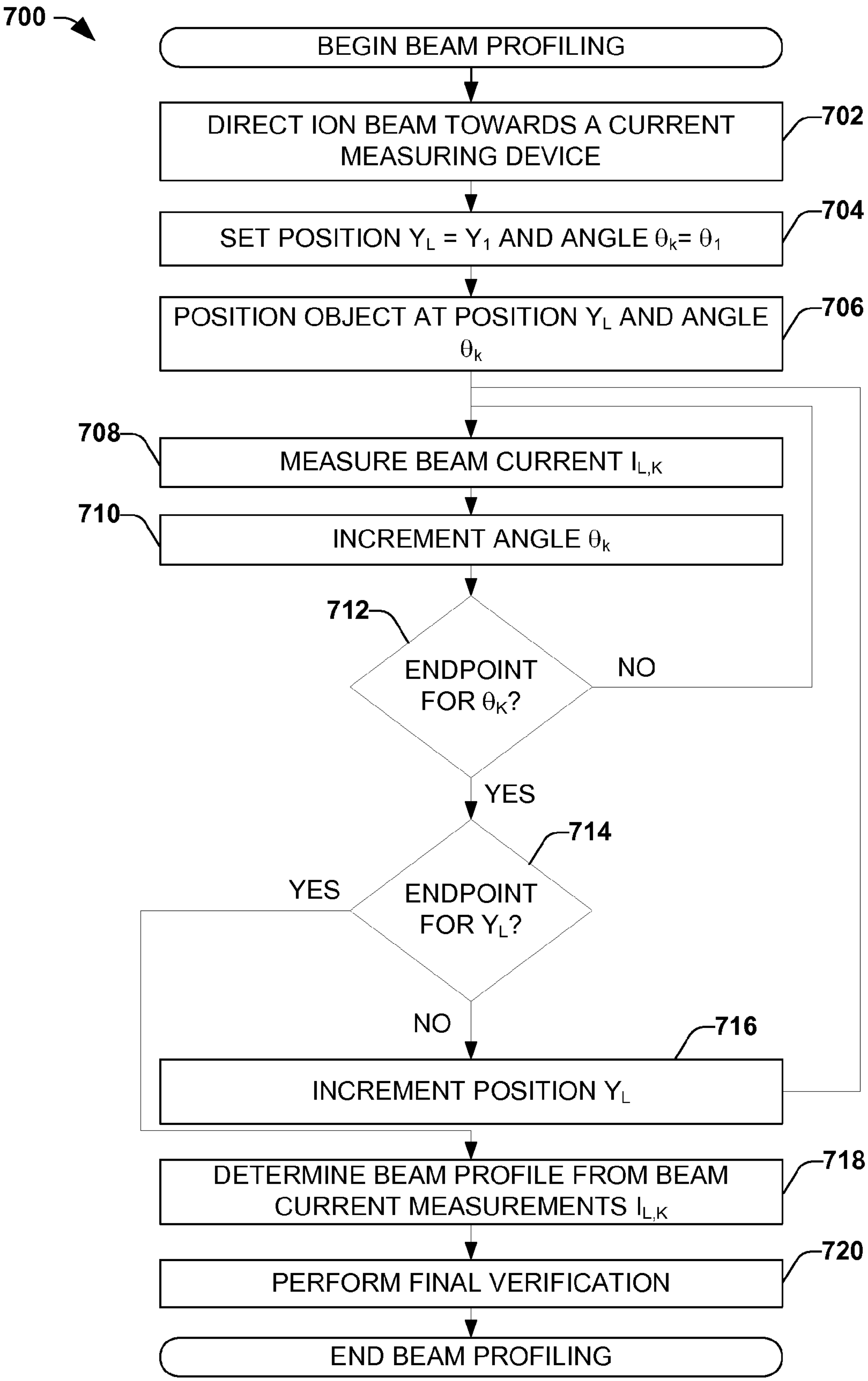
FIG. 7 shows one embodiment of a flowchart in accordance with aspects of the present invention.

Referring now to FIG. 7, one can see one embodiment of a method for determining a beam profile. In block 702, the ion beam is directed towards the current measuring device. In block 704 the position $y_L$ and angle $\theta_K$ are initialized (i.e., $y_L=y_1$ and $\theta_K=\theta_1$).

In block 706 the object is positioned at the current position (e.g., $y_1$) and current angle (e.g., $\theta_1$). In one embodiment, this could correspond to FIG. 4A.

In block 708 a beam current that is representative of the particular position and angle is measured and stored. After the beam current is measured, the angle is incremented in step 710 (which could correspond to FIG. 4B, for example), and a determination is made whether this angle is the last angle for a particular distance. If the angle is not the last angle or endpoint ("NO" at 712), and the beam current is measured the angle is incrementally updated accordingly.

If the angle is the last angle or endpoint ("YES" at 712), a determination is made as to whether all distances have been measured in block 714. If not ("NO" at 714), then the position $y_L$ is incremented at block 716, which may correspond to the operation and between FIG. 5E and FIG. 5F. Again the beam currents and angles are successively measured and incremented in blocks 708-714.

If all of the desired distances have been measured ("YES" at 714), then the method 700 proceeds to block 718 wherein the beam profile is determined from the beam current measurements. Although there are various ways in which the beam profile could be determined here, in one embodiment the calculation of beam modulation factors and solution of a system of linear equations as previously discussed is used.

In the illustrated embodiment, a final verification that serves as a "sanity check" is performed at block 720, although the final verification could be performed at any time before, during or after the beam profiling operation. In one embodiment of the final verification, the object is moved to a position such that that it allows the beam to pass completely unobstructed. The total beam current is then measured periodically to ensure that it is constant. If the total beam current varies while the beam is completely unobstructed, the profiler calculation could be incorrect due to unexpected dynamic variations in the beam itself.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An apparatus for profiling an ion beam comprising:

a current measuring device having a measurement region, wherein a cross-sectional area of the ion beam enters the measurement region;

a beam varying device configured to adjust the cross-sectional area of the ion beam entering the measurement region, wherein the beam varying device comprises an object configured to at least partially obstruct the cross sectional area of the ion beam that enters the measurement region, wherein the object is configured to move in a pendulum-like, oscillating fashion back and forth multiple times past the ion beam with an amount of the object obstructing the ion beam changing between at least two of the oscillations; and a controller configured to periodically receive beam current measurements of the ion beam from the current measuring device and to determine a two dimensional profile of the ion beam by relating the beam current measurements to sub-regions within the current measuring device.

2. The apparatus of claim 1, wherein the sub-regions are arranged in at least substantially grid-like fashion.

3. The apparatus of claim 1, wherein the moving object that obstructs portions of the ion beam defines subregions of the current measuring device as the current measuring device receives an un-obstructed portion of the ion beam, and wherein for multiple measurements at different positions of the object with respect to the ion beam, the data provided to the controller is represented by a system of linear equations with each subregion having an ion beam current contribution associated therewith that is modulated by a multiplication factor that is a function of the location of the object such that for multiple object locations dictated by an angle Θk and an object translation position yL a matrix is defined, wherein the controlleris configured to employ the linear equations and matrix data together to determine a current for each of the subregions and thus ascertain a two-dimensional ion beam profile.

4. The apparatus of claim 1, wherein the apparatus performs real-time monitoring of the beam profile by repeatedly determining the beam profile.

5. The apparatus of claim 4, wherein the real-time profiling is performed during implantation of a workpiece.

6. The apparatus of claim 1, wherein the sub-regions are a mathematical construction.

7. The apparatus of claim 6, wherein the current measuring device comprises at least one Faraday cup.

8. A method for determining a two-dimensional beam profile of an ion beam, comprising:

directing the ion beam towards a current measuring device having a measurement region;

varying a cross-sectional area of the ion beam entering the measurement region wherein varying a cross-sectional area of the ion beam that enters the measurement region comprises using an object to at least partially obstruct the cross-sectional area the ion beam, thereby establishing an unobstructed part of the ion beam and an obstructed part of the ion beam, wherein the object moves in a pendulum-like, oscillating fashion back and forth multiple times past the ion beam with a length of the object obstructing the ion beam changing between at least two of the oscillations; and determining the two-dimensional beam profile by periodically taking beam current measurements as the cross-sectional area of the ion beam that enters the measurement region is varied, and relating the beam current measurements to sub-regions within the measurement region.

9. The method of claim 8, wherein the method further comprises:

performing a verification while the object does not obstruct the ion beam by periodically taking beam current measurements to check if a total beam current remains constant.

10. The method of claim 8, wherein unobstructed sub-regions are associated with the unobstructed part, obstructed sub-regions are associated with the obstructed part, and at least one partially obstructed sub-region is positioned between one of the unobstructed sub-regions and one of the obstructed sub-regions.

11. The method of claim 8, wherein the beam current measurements are taken as a function of a rotational angle of the object.

12. The method of claim 8, wherein the beam current measurements are taken as a function of a distance over which the object is translated.

13. The method of claim 8, wherein the beam current measurements are taken as a function of both a distance over which the object is translated and a rotational angle of the object.

14. The method of claim 8, wherein moving the object that obstructs portions of the ion beam defines subregions of the beam, and wherein for multiple measurements at different positions of the object with respect to the ion beam, the data from the measurements is represented by a system of linear equations with each subregion having an ion beam current contribution associated therewith that is modulated by a multiplication factor that is a function of the location of the object such that for multiple object locations dictated by an angle Θk and an object translation position yL a matrix is defined, and wherein determining the two-dimensional profile comprises employing the linear equations and matrix data together to determine a current for each of the subregions and thus ascertain the two-dimensional ion beam profile.

* * * * *

UNITED STATES PATENT AND TRADEMARK OFFICE

CERTIFICATE OF CORRECTION

PATENT NO. : 7,701,230 B2
APPLICATION NO. : 11/742178
DATED : April 20, 2010
INVENTOR(S) : Ye et al.

It is certified that error appears in the above-identified patent and that said Letters Patent is hereby corrected as shown below:

Column 8, claim 3, line 64; please replace “controlleris” with --controller is--
Column 10, claim 14, lines 22 and 23; please replace “of the beam” with --of the ion beam--

Signed and Sealed this

Thirty-first Day of August, 2010

David J. Kappos
*Director of the United States Patent and Trademark Office*